United States Patent [19]

Terasawa et al.

[11] Patent Number: 4,713,679

[45] Date of Patent: Dec. 15, 1987

[54] REVERSE BLOCKING TYPE SEMICONDUCTOR DEVICE

[75] Inventors: Yoshio Terasawa, Katsuta; Saburo Oikawa, Hitachi, both of Japan

[73] Assignee: Hitachi, Ltd., Tokyo, Japan

[21] Appl. No.: 787,116

[22] Filed: Oct. 15, 1985

[30] Foreign Application Priority Data

Oct. 15, 1984 [JP] Japan .................. 59-215689
Mar. 23, 1985 [JP] Japan .................. 60-58950

[51] Int. Cl.$^4$ .................. H01L 29/74; H01L 29/80
[52] U.S. Cl. .................. 357/38; 357/90; 357/22
[58] Field of Search .................. 357/38, 90, 22 E

[56] References Cited

U.S. PATENT DOCUMENTS 4,292,646 9/1981 Assour et al. .................. 357/38
4,617,583 10/1986 Shinohe et al. .................. 357/38

FOREIGN PATENT DOCUMENTS 0178369 7/1982 Japan .

Primary Examiner—Martin H. Edlow
Assistant Examiner—Robert P. Limanek
Attorney, Agent, or Firm—Antonelli, Terry & Wands

[57] ABSTRACT

A reverse blocking type semiconductor device capable of being rapidly turned off is disclosed in which a semiconductor substrate includes four semiconductor layers in a region sandwiched between a pair of principal surfaces in such a manner that adjacent ones of these layers are different in conductivity type from each other, one outermost layer of the layers is surrounded by the layer adjacent to the one outermost layer, the one outermost layer and the layer adjacent thereto are exposed to one principal surface, a cathode electrode kept in low-resistance contact with one outermost layer, a gate electrode is kept in low-resistance contact with the layer adjacent to the one outermost layer and lies in close proximity to the one outermost layer, an anode electrode is kept in low-resistance contact with the other outermost layer at the other principal surface, and a main operating region of the other outermost layer has an impurity concentration gradient in a direction parallel to the anode electrode.

10 Claims, 16 Drawing Figures

FIG. IA
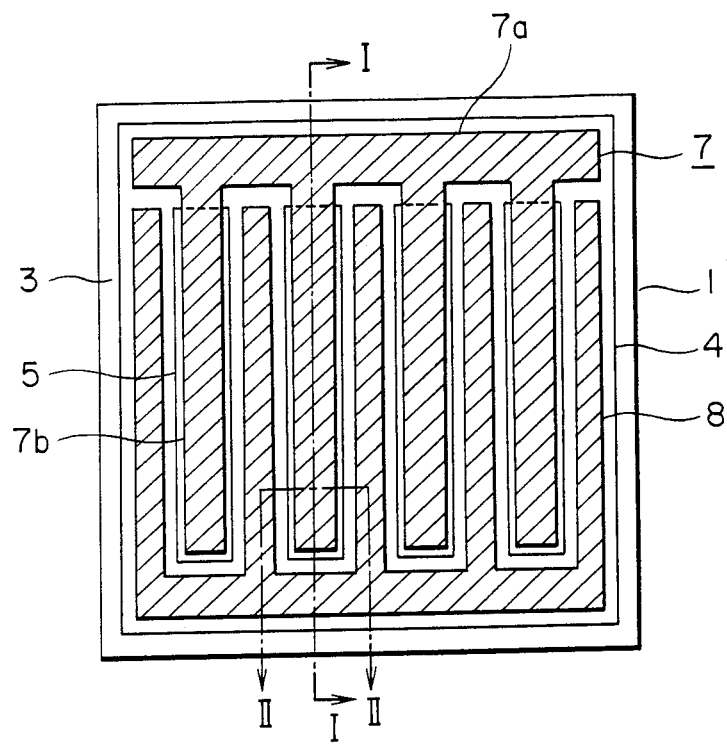
FIG. IB
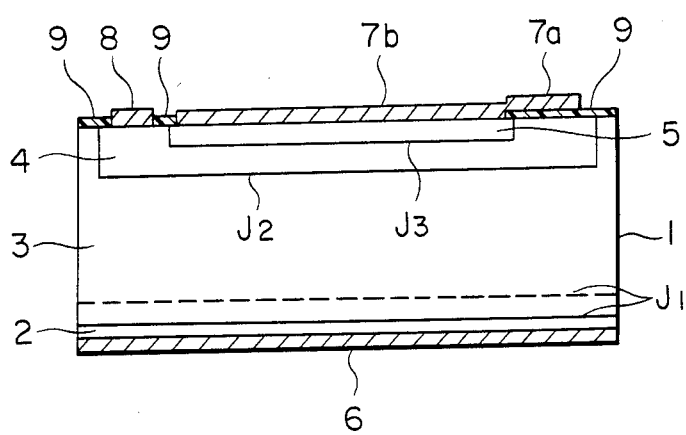
FIG. IC
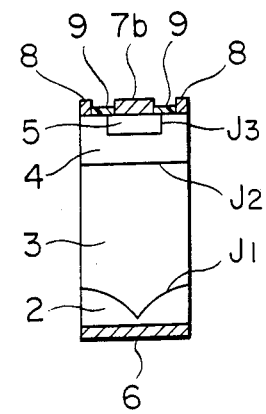

REVERSE BLOCKING TYPE SEMICONDUCTOR DEVICE

BACKGROUND OF THE INVENTION

The present invention relates to a semiconductor device, and more particulary to a reverse blocking type switching device which can be rapidly turned off without containing any lifetime killer, (for example, a gate turnoff thyristor, an electrostatic induction type thyristor, and others).

A gate turn-off thyristor (hereinafter simply referred to as "GTO") is classified into two groups. In one of the groups, the emitter junction on the anode side is not short-circuited by an anode electrode, as shown in FIGS. 1 and 4 of a Japanese Patent Unexamined Publication No. 57-178369. In the other group, the emitter junction on the anode side is shorted by an anode electrode, as shown in FIG. 2 of the above Japanese Patent Application. The former group has a reverse blocking function. In this group, however, a lifetime killer is added to the whole of a semiconductor substrate to enhance the turn-off speed, and hence there arises a problem that a leak current in a blocking state becomes large. The latter group can perform a high-speed operation without containing any lifetime killer, and hence the leak current in the blocking state is small. However, the latter group does not have the reverse blocking function. That is, each of the two groups has both merits and demerits. The same is true of an electrostatic induction type thyristor.

SUMMARY OF THE INVENTION

It is therefore an object of the present invention to provide a semiconductor device which has a reverse blocking function, can operate at a high speed without containing any lifetime killer, and is small in leak current.

In order to attain the above object, according to one aspect of the present invention, there is provided a semiconductor device in which a main operating region of an emitter layer on the anode side has an impurity concentration gradient in a direction parallel to an anode electrode, to generate a diffusion current toward the anode electrode, thereby sweeping out carries in the emitter layer to the anode electrode.

Further, according to another aspect of the present invention, that portion of the emitter layer on the anode side which has the above impurity concentration gradient, is made wider than that portion of the emitter layer which does not have such an impurity concentration gradient.

When the semiconductor device according to the present invention is turned off, carriers are not only extracted from a semiconductor substrate through a gate electrode but also swept out to the anode electrode in the form of a diffusion current, and therefore carriers in the semiconductor substrate rapidly decreases. Accordingly, it is not required to dope a lifetime killer to the semiconductor substrate and to short the emitter layer on the anode side by the anode electrode. Thus, the semiconductor device has the reverse blocking capability, is small in leak current, and can perform a high-speed turnoff action.

BRIEF DESCRIPTION OF THE DRAWINGS

FIG. 1A is a plan view of a GTO which is an embodiment of the present invention, viewed from the cathode side.

FIG. 1B is a longitudinal sectional view taken along the line I—I of FIG. 1A.

FIG. 1C is a transverse sectional view taken along the line II—II of Fig. 1A.

DESCRIPTION OF THE PREFERRED EMBODIMENTS

Figure 2:
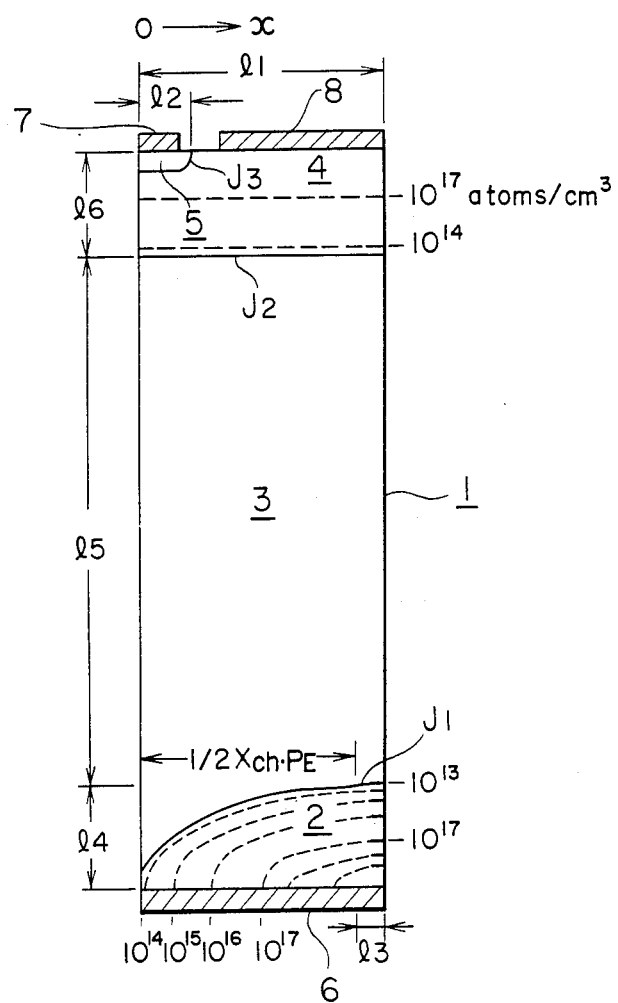
FIG. 2 is a transverse sectional view of that part of a model GTO element according to the present invention which corresponds to one-half of Fig. 1C.

Referring to FIGS. 1A, 1B and 1C which show a GTO according to the present invention, a silicon substrate 1 includes four silicon layers, adjacent ones of which are different in conductivity type from each other. In more detail, the silicon substrate 1 includes a p-emitter layer 2, an n-base layer 3, a p-base layer 4 and an n-emitter layer 5 between upper and low principal surfaces, in the order described in the direction from the lower principal surface to the upper principal surface. The n-emitter layer 5 is divided into strip-shaped regions, each of which is surrounded by the p-base layer 4. An anode electrode 6 is kept in low-resistance contact with the p-emitter layer 2, a gate electrode 8 is kept in low-resistance contact with the p-base layer 4 so that each strip-shaped n-emitter region 5 is substantially surrounded by the gate electrode 8, and a cathode electrode 7 is kept in low-resistance contact with the strip-shaped n-emitter regions 5. A silicon oxide film 9 is provided on the upper principal surface so as to serve as a surface passivation film for the exposed portions of a central junction $J_2$ and an emitter junction $J_3$ on the cathode side. Incidentally, the silicon oxide film 9 is omitted in FIG. 1A for brevity's sake. A portion 7a of the cathode electrode 7 is provided on the silicon oxide film 9, and bridges digital portions 7b of the cathode electrode 7. The thickness of the p-emitter layer 2 is smallest under the center line of each strip-shaped n- emitter region 5 viewed in the direction of the width thereof.

FIG. 2 shows the structure of that part of a model GTO designed by calculation in accordance with the present invention which corresponds to the right half of FIG. 1C, various dimensions of the above part, and the impurity concentration distribution in each of the p-emitter layer 2 and p-base layer 4. Referring to FIG. 2, the half width $l_1$ of the model GTO is equal to 50 μm, the half width $l_2$ of the n-emitter region 5 is equal to 10 μm, the width $l_3$ of a boron deposition area, (namely, a surface area where boron is deposited to form the p-emitter layer 2 by selective diffusion) is equal to 5 μm, a maximum depth $l_4$ of the p-emitter layer 2 thus formed is equal to 60 μm, the diffusion depth $l_6$ of the p-base layer 4 is equal to 60 μm, and a minimum thickness $l_5$ of the n-base layer 3 is equal to 280 μm.

Further, a maximum impurity concentration at the surface of each of the p-emitter layer 2 and the p-base layer 4 is made equal to $7 \times 10^{17}$ atmos/cm$^3$, and it is supposed that the lateral diffusion of boron (that is, the diffusion of boron in the x-direction of FIG. 2) extends to a position corresponding to 80% of the diffusion depth in the direction perpendicular to the principal surfaces. When the width of an area where boron is not deposited, is considered to be a channel width $X_{chPE}$, one-half of the channel width $X_{chPE}$ is 45 μm. In FIG. 2, broken lines indicate equi-impurity-concentration curves, and numerals written together with the broken lines indicate the number of impurity atoms per cm$^3$.

The impurity concentration in the n-base layer 3 is $3 \times 10^{13}$ atoms/cm$^3$, and the lifetime of carriers in this layer is 40 μs.

Further, it is supposed that the lifetime $\tau(x, y)$ of carriers at a point (x, y) having an impurity concentration N (x, y) is given by an equation $\tau(x, y)=(3\times 10^{13}/N(x, y))^{0.4}\times 40$ μs.

As shown in FIGS. 1C and 2, the present invention has a feature that a pair of boron deposition area with a width $l_3$ is provided at a constant interval $X_{chCE}$, a thermal diffusion takes place, and such a pair of p-emitter layer is superposed by a transversal diffusion that a reverse blocking capability is obtained.

The emitter junction $J_1$ on the anode side is not shorted by the anode electrode 6, but is continuous as shown in FIGS. 1C and 2. Accordingly, the junction $J_1$ can block a reverse voltage which is applied between the anode electrode 6 and the cathode electrode 7 at a positive potential with respect to the anode electrode 6. That is, the model GTO has a reverse blocking capability. Especially in the device according to the present invention, as shown in FIGS. 1C and 2, impurity concentration is low at the central part (x=0 in FIG. 2) of the p-emitter and the thickness is small, so that a blocking voltage in this area alone is low. Therefore, it is a feature of the present invention that a depletion layer which is spreading out from a emitter junction $J_1$ consisting of a p-emitter 2 and an n-base layer 3, with high impurity concentration and layer thickness, adjacent to each other at the central part reaches the central part of emitter junction $J_1$, so that the central part of the emitter junction $J_1$ is capable of blocking a reverse voltage. It has been confirmed by a calculation and an experiment that a reverse voltage of at least 1500 V can be blocked in a model device as shown in FIG. 2. Furthermore, in the vicinity of the central part of the p-emitter as mentioned above, carriers are swept out towards an anode electrode, thereby making it possible to turn off the device at a high speed. Accordingly, a high speed GTO with high reverse blocking capability is realized.

The model GTO can be turned on in the same manner as a conventional GTO. That is, when a voltage is applied between the gate electrode 8 and the cathode electrode 7 so that the gate electrode 8 is at a positive potential with respect to the cathode electrode 7, and a forward voltage is applied between the anode electrode 6 and the cathode electrode 7 so that the anode electrode 6 is at a positive potential with respect to the cathode electrode 7, the model GTO is turned on.

In the ON-state of the model GTO, since the impurity concentration gradient in a direction parallel to the anode electrode 6 is formed in the p-emitter layer 2 as shown in FIG. 2, carriers (holes and electrons) flow in a direction, in which the impurity concentration decreases, by diffusion, and reach the anode electrode 6. That is, even when the model GTO is kept at the ON-state, some of the holes in the p-emitter layer 2 are swept out to the anode electrode 6.

Figure 3:
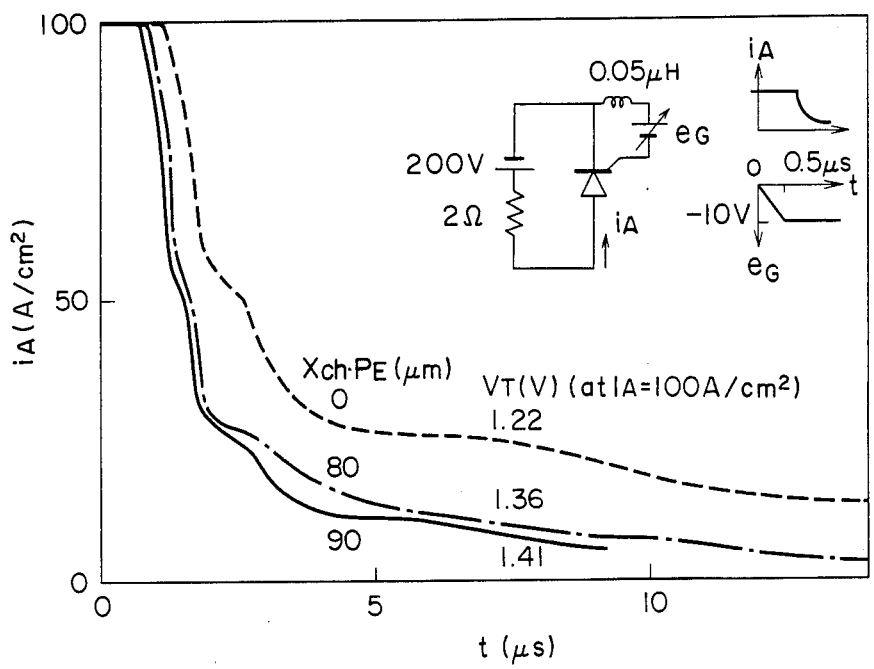
FIG. 3 is a graph showing the turn-off operation of the model GTO element of FIG. 2.

The model GTO is turned off in such a manner as indicated by a measuring circuit in FIG. 3. That is, a turn-off signal for making the potential of the gate electrode 8 negative with respect to that of the cathode electrode 7 is applied between the gate electrode 8 and the cathode electrode 7 to extract carriers from the silicon substrate 1 through the gate electrode 8, thereby turning off the model GTO.

FIG. 3 shows how turn-off characteristics are dependent upon the channel width $X_{chPE}$. In FIG. 3, a broken line indicates the turn-off characteristics of a conventional GTO having the same structure as the model GTO of FIG. 2, excepting that the channel width $X_{chPE}$ is zero, a solid line indicates the turn-off characteristics of the abovementioned model GTO which has a channel width $X_{chPE}$ of 90 μm, and a dot-dash line indicates the turn-off characteristics of another model GTO which has an channel width $X_{chPE}$ of 80 μm. As can be seen from FIG. 3, only by making the ON-voltage $V_T$ of the model GTO's higher than that of the conventional GTO by 0.1 to 0.2 V, the anode current $i_A$ of each of the model GTO's can decrease in a time which is one-third to one-fifth of a time required for decreasing the anode current of the conventional GTO, though the model GTO's contain no lifetime killer.

Now, a reason why a GTO according to the present invention can be rapidly turned off, will be explained below in detail.

Figure 4:
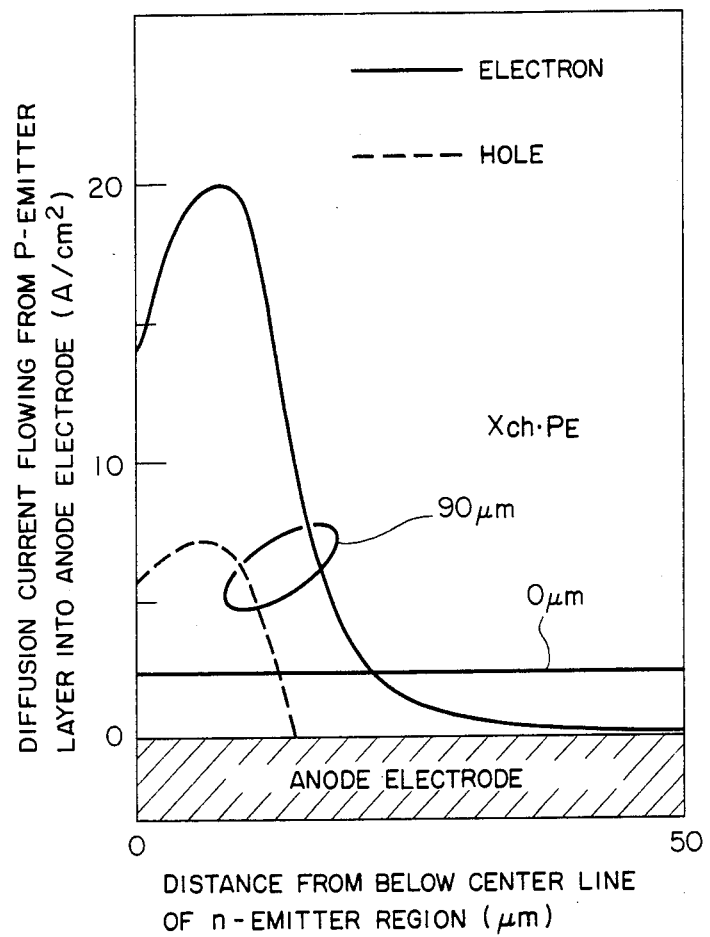
FIG. 4 is a graph showing how carriers are swept out to the anode electrode in the model GTO element of FIG. 2.

FIG. 4 shows how carriers in the model GTO having the above-mentioned dimensions and impurity concentration gradient are swept out. In FIG. 4, the abscissa indicates a distance from the left end of FIG. 2 (that is, the center line of the n-emitter region 5 viewed in the direction of the width thereof) measured in a direction parallel to the anode electrode 6, and the ordinate indicates the current density (A/cm$^2$) of each of diffusion currents due to holes and electrons which are swept out to the anode electrode 6 at a time the anode current density $i_A$ of FIG. 3 has decreased to 10 A/cm$^2$. Further, in FIG. 4, a solid line and a broken line indicate a diffusion current due to electrons and a diffusion current due to holes, respectively, the description that $X_{chPE}$ is 90 μm indicates the model GTO having a channel width of 90 μm, and the description that $X_{chPE}$ is 0 μm indicates the conventional GTO in which the impurity concentration gradient in a direction parallel to the anode electrode 6 does not exist in the p-emitter layer and the emitter junction on the anode side is not shorted by the anode electrode. In this conventional GTO, the emitter junction on the anode side is flat, and the impurity concentration in the p-emitter layer decreases only in the direction toward the cathode side. Accordingly, a diffusion current due to positive holes flows only toward the cathode side. Thus, a hole diffusion current which flows into the anode electrode 6, does not exist in the conventional GTO, and hence is not shown in FIG. 4.

As mentioned above, the diffusion current density shown in FIG. 4 is measured, when the anode current density $i_A$ has decreased to 10 A/cm$^2$ after a turn-off operation was started. It can be seen from FIG. 4 that a diffusion current caused by holes and having a maximum current density of about 7 A/cm$^2$ flows into the anode electrode 6. Further, FIG. 4 shows that the diffusion current density decreases just below the center line of the n-emitter region. This is because the impurity concentration and the density of positive hole are small at this position.

As explained above, in the model GTO according to the present invention, an impurity concentration gradient in a direction parallel to the anode electrode 6 is formed in the p-emitter layer 2, and thus a large number of holes and electrons are swept out to the anode electrode 6. Accordingly, the model GTO can be rapidly turned off, though no lifetime killer is doped in the semiconductor substrate 1.

Figure 5:
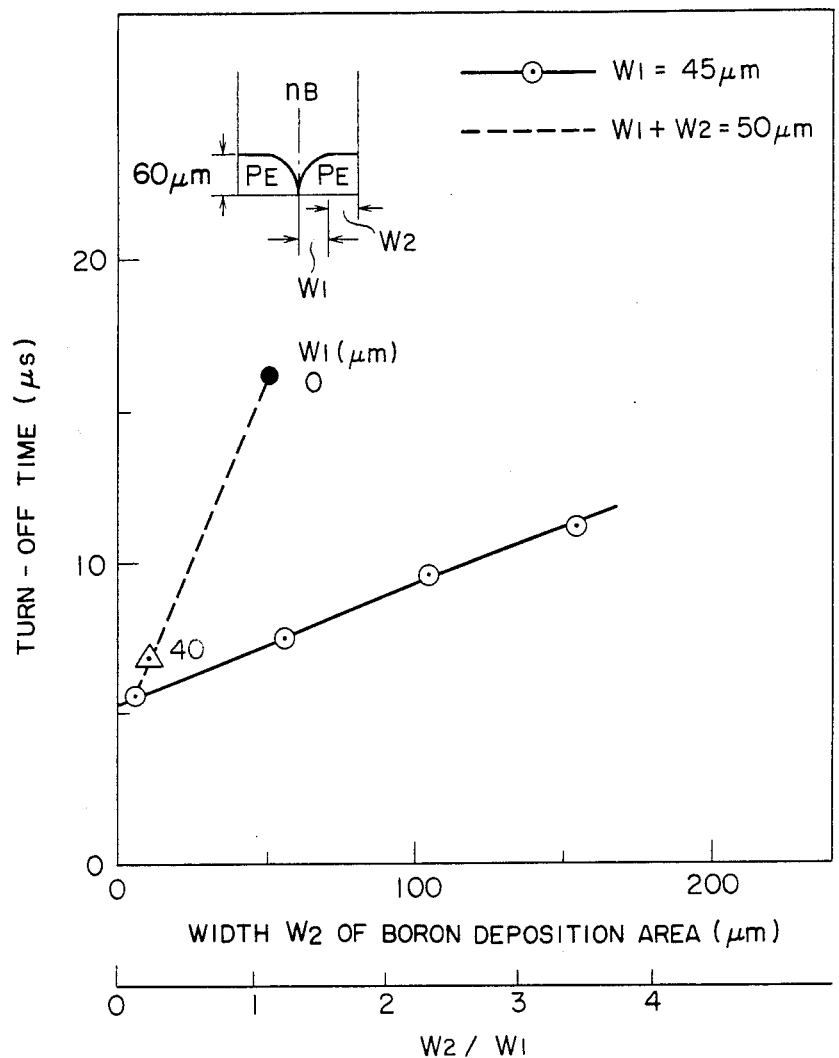
FIG. 5 is a graph showing a relationship between the form of p-emitter layer and a turn-off time.

FIG. 5 shows the variation of turn-off time with the channel width $X_{chPE}$. In FIG. 5, reference symbol $W_1$ designates one-half of the channel width $X_{chPE}$, and $W_2$ corresponds to the length $l_3$ of FIG. 2. Further, in FIG. 5, the ordinate indicates a turn-off time obtained by the measuring circuit of FIG. 3, a solid line indicates the variation of turn-off time with the width $W_2$ in a case where the width $W_1$ is kept at 45 μm, and a broken line indicates the variation of turn-off time with the width $W_2$ in a case where the width $W_1+W_2$ is kept at 50 μm. In either case, the turn-off time increases with the width $W_2$. Accordingly, in order to shorten the turn-off time, it is required to make the width $W_2$ as small as possible. Incidentally, a black point in FIG. 5 which is indicated by $W_1=0$ μm, shows that the conventional GTO in which the impurity concentration gradient in a direction parallel to the anode electrode does not exist in the p-emitter layer, has a turn-off time of 16 μs.

As can be seen from FIG. 5, in order to make the turn-off time at least less than 8 μs, it is necessary to make a ratio $W_2/W_1$ less than two (2).

According to the present invention, no lifetime killer is doped in the semiconductor substrate 1. Accordingly, a leak current caused by the lifetime killer is scarcely found in the reverse blocking state.

As mentioned above, according to the present invention, there is provided a GTO which has a reverse blocking capability, contains no lifetime killer to reduce a leak current, and yet can perform a high-speed turn-off.

Next, experimental data obtained by trial GTO's which have been fabricated as an embodiment of the present invention, will be explained below.

Figure 6:
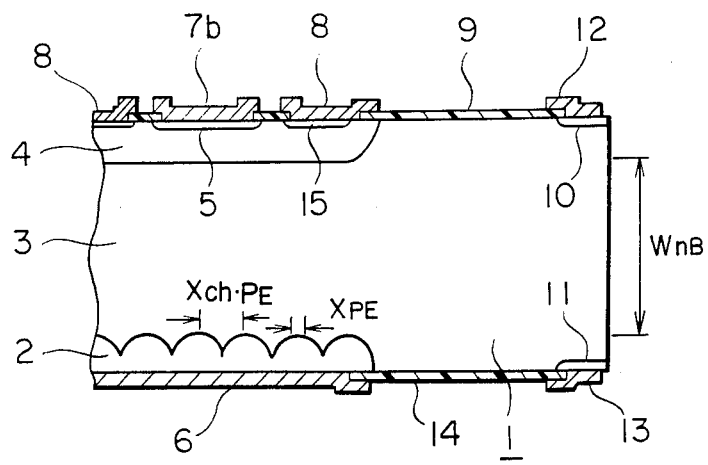
FIG. 6 is a longitudinal sectional view showing part of a GTO made by way of trial in accordance with the present invention.

FIG. 6 is a fragmentary sectional view showing a trial GTO according to the present invention. In FIG. 6, the same reference numerals as in FIGS. 1A to 1C designate like parts. Further, in FIG. 6, reference numerals 10 and 11 designate highly-doped n-layers provided in the n-base layer 3, that is, channel stoppers, 12 and 13 electrodes provided on the channel stoppers 10 and 11, 14 a silicon oxide film provided on the lower principle surface, and 15 a highly-doped p-layer kept in contact with the gate electrode 8, that is, a contact layer.

Referring to FIG. 6, the maximum depth of the p-emitter layer 2 (corresponding to the length $l_4$ of FIG. 2) is made equal to 60 μm, the depth of the p-base layer 4 (corresponding to the length $l_6$ of FIG. 2) is made equal to 60 μm, the width of the n-emitter region 5 is made equal to 300 μm, the width of the contact layer 15 is made equal to 200 μm, the distance between the p-base layer 4 and the channel stopper 10 measured on the upper principal surface is made equal to 350 μm, the length of the n-emitter region 5 is made equal to 5.5 mm, and eight n-emitter regions each having the above-mentioned width and length are formed in the silicon substrate 1 having dimensions of 7.5 mm × 6.2 mm. Further, the lifetime of carriers in the n-base layer 3 is about 40 μs, and the rated effective current of the trial GTO is 50 A.

Figure 7:
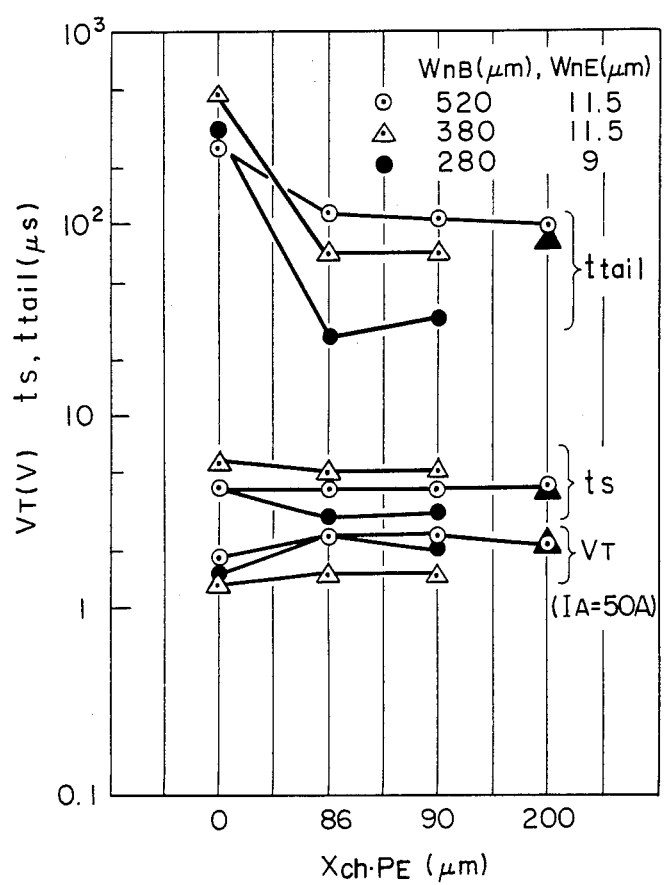
FIG. 7 is a graph showing characteristics of the trial GTO of FIG. 6.

FIG. 7 shows the variation of an ON-voltage $V_T$ for an anode current of 50 A with the channel width $X_{chPE}$, the variation of a storage time $t_S$ required when an anode current of 20 A is turned off by application of a gate voltage of −12 V (namely, a time necessary for the anode current to begin to decrease after a turn-off gate current began to flow) with the channel width $X_{chPE}$ and the variation of a tail time $t_{tail}$ (namely, a time necessary for a tail current to reach zero after the anode current began to decrease) with the channel width $X_{chPE}$, for three kinds of combinations of the thickness of the n-base layer 3 (corresponding to the length $l_5$ of FIG. 2) and the thickness $W_{nE}$ of the n-emitter region 5.

In the trial GTO's having a channel width $X_{chPE}$ of 86 μm or 90 μm, the width of that portion of the p-emitter layer 2 which has a maximum depth (that is, the width of a boron deposition area) $X_{PE}$ is made equal to 20 μm. Further, in FIG. 7, points indicated by $X_{chPE}=0$ μm show data with respect to conventional reverse blocking GTO's, and points indicated by $X_{chPE}=200$ μm show data with respect to conventional GTO's in which the emitter junction $J_1$ on the anode side is shorted by the anode electrode.

As is apparent from FIG. 7, the trial GTO's according to the present invention are far shorter in tail time than the conventional reverse blocking GTO's. Further, in the trial GTO's, the tail time decreases as the thickness $W_{nB}$ of the n-base layer 3 is smaller. It is to be noted that the trial GTO's are substantially equal in ON-voltage $V_T$ and storage time $t_s$ to the conventional GTO's. Additionally speaking, the trial GTO's according to the present invention have a forward blocking voltage of 1200 V and a reverse blocking voltage of 1200 V, and the leak current of the trial GTO's is 0.4 mA at a junction temperature of 125° C. Such a leak current is less than one-tenth of the leak current of a conventional GTO in which the lifetime killer of gold is doped in the semiconductor substrate 1.

In the above explanation, the selective diffusion of boron is used for forming an impurity concentration gradient in the p-emitter layer 2 in a direction parallel to the anode electrode 6, and thus the emitter junction $J_1$ on the anode side has a wavelike shape. Various, methods for forming the above impurity concentration gradient can be used. Further, in a case where the emitter junction $J_1$ on the anode side is formed so as to have a wavelike shape, a number of semispherical surfaces forming the emitter junction $J_1$ may be arranged in longitudinal and transverse directions at a place just below the strip-shaped n-emitter region 5. In other words, it is the gist of the present invention that an impurity concentration gradient capable of sweeping out holes is formed in a main operating region.

When the above-mentioned impurity concentration gradient is formed in the p-emitter layer 2, if the thickness of the p-emitter layer 2 is made small and the impurity concentration in the p-emitter layer 2 is made low to increase the turn-off speed of GTO, the punch-through voltage for the p-emitter layer 2 will decrease, and a reverse blocking voltage of the p-emitter layer itself will be lowered. Accordingly, it is preferred to use means for withstanding a high voltage such as making the slope of the emitter junction $J_1$ on the anode side steep so as to generate the pinch-off in the channel region, together with the above-mentioned impurity concentration gradient.

Figure 8:
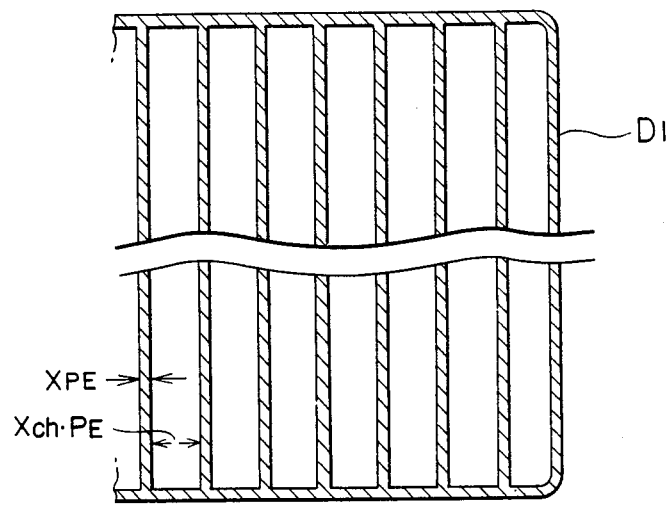
FIGS. 8 and 9 are schematic diagrams showing examples of a boron deposition pattern for forming a p-emitter layer.

FIG. 8 shows part of an example of a pattern indicating an area where boron is deposited prior to a diffusion process for forming the p-emitter layer 2. In FIG. 8, a hatched area $D_1$ indicates an area where boron is deposited. Referring to FIG. 8, each of the width $X_{PE}$ of the deposition area $D_1$ and the channel width $X_{chPE}$ is kept substantially constant throughout the surface of the p-emitter layer 2. Thus, carriers are injected or swept out equally at every channel region. Further, as shown in FIG. 8, the peripheral portion of the lower principal surface may be surrounded by the p-emitter layer 2. Then, that peripheral portion of the emitter layer on the anode side has the same breakdown voltage, and hence the breakdown voltage of a GTO having such a semiconductor substrate can be enhanced.

Figure 9:
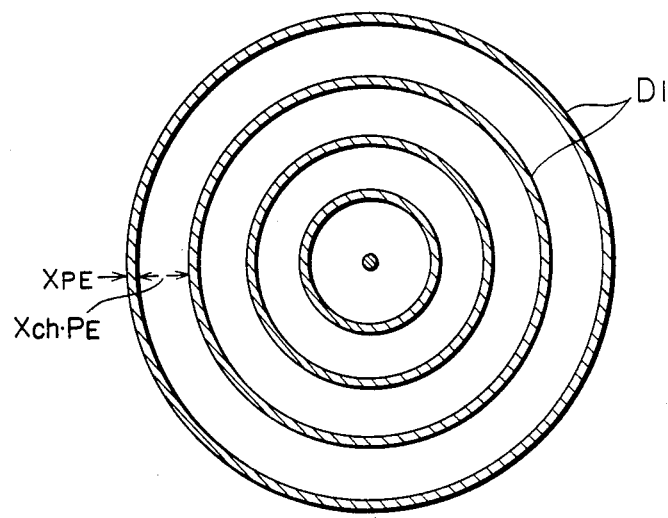

FIG. 9 shows part of a pattern indicating a plurality of concentric, ring-shaped areas where boron is deposited. Such a boron deposition pattern can also be used.

Figure 10:
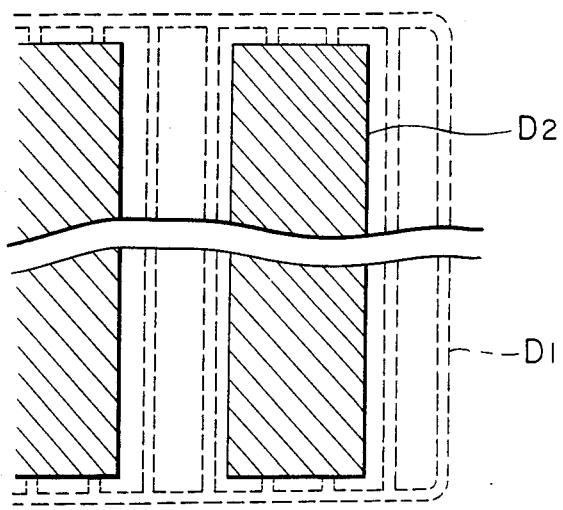
FIGS. 10 to 12 are schematic diagrams showing examples of both a boron deposition pattern for forming a p-emitter layer and a phosphorous deposition pattern for forming an n-emitter layer.
Figure 11:
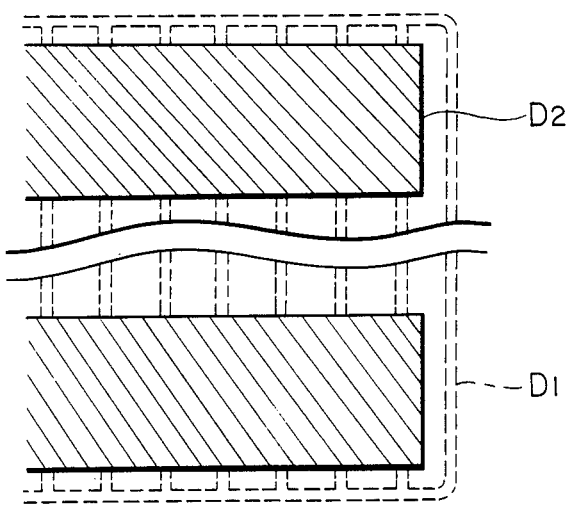
Figure 12:
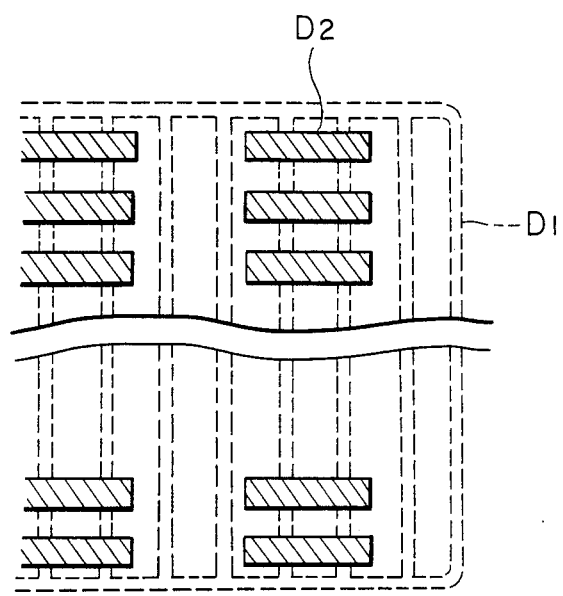

FIGS. 10 to 12 show positional relations between the deposition pattern $D_2$ of phosphorus for forming the n-emitter regions 5 and the deposition pattern $D_1$ of boron for forming the p-emitter layer 2. In more detail, FIG. 10 shows a case where the patterns $D_1$ and $D_2$ are parallel to each other when projected onto a plane parallel to the principal surfaces, and FIGS. 11 and 12 show cases where the patterns $D_1$ and $D_2$ intersect with each other when projected onto the above plane. According to the combination of the patterns $D_1$ and $D_2$ shown in each of FIGS. 10 to 12, carriers are injected or swept out equally at every channel region.

The strip-shaped n-emitter regions can be formed in various arrangement. That is, an arc-shaped arrangement disclosed in a Japanese Patent Examined Publication No. 50-31436, a chevron-shaped arrangement disclosed in a Japanese Patent Unexamined Publication No. 57-80771, a radial arrangement disclosed in a Japanese Patent Unexamined Publication No. 56-131955, a comb-like arrangement disclosed in a Japanese Patent Examined Publication No. 55-25508, and a backbone-shaped arrangement may be used.

In the foregoing, a GTO according to the present invention has been explained by way of example. However, the present invention is not limited to the GTO, but is applicable to a diode, other thyristors such as a static induction (Field Controlled) type thyristor and a conductivity modulation type MOSFET (namely, a COMFET) in which a p-emitter layer is added to a MOSFET.

Figure 13:
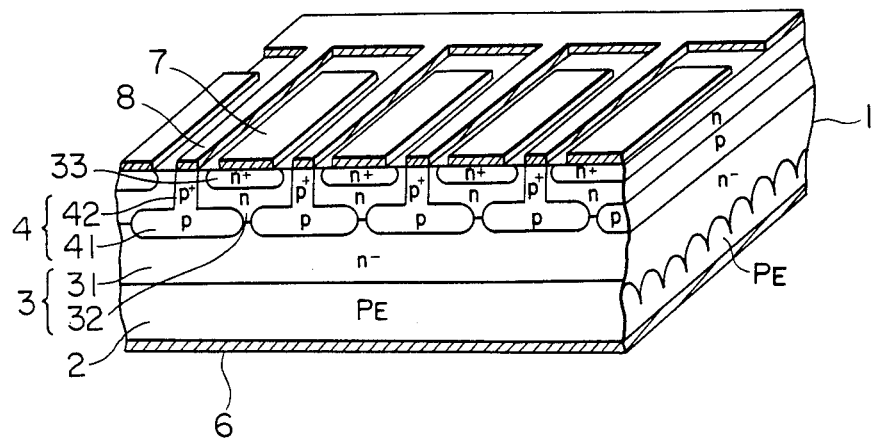
FIG. 13 is a view, partly perspective and partly cross-sectional, of an electrostatic induction type thyristor which is another embodiment of the present invention.

FIG. 13 shows a case where the present invention is applied to a static induction type thyristor disclosed in U.S. Pat. No. 4,223,328. In FIG. 13, the same reference numerals as in FIGS. 1A to 1C designate identical or equivalent parts. Referring to FIG. 13, the n-base layer 3 includes an $n^-$-layer 31 adjacent to the p-emitter layer 2 and an n-layer 32 adjacent to an $n^+$-layer 33. A gate layer 4 includes a p-layer 41 which is extended between the $n^-$-layer 31 and the n-layer 32 and is divided into a plurality of regions each having the form of a flat plate, and a $p^+$-layer 42 which is extended from the upper principal surface to the p-region 41 in the direction of the thickness of the semiconductor substrate 1. A junction which is formed between the $n^-$-layer 31 and the n-layer 32 and lies between adjacent p-regions 41, acts as a channel region. This channel region is located just below the $n^+$-layer 33. The lengthwise direction of the channel region makes a right angle with the lengthwise direction of each of the concave and convex portions of a wavelike pn junction formed between the p-emitter layer 2 and the $n^-$-layer 31.

When a voltage is applied between the cathode electrode 7 and the gate electrode 8 so that the gate electrode 8 is at a negative potential with respect to the cathode electrode 7, a depletion layer is formed around the gate layer 4. When adjacent depletion layers connect with each other at the channel region, a current flowing from the anode electrode 6 to the cathode electrode 7 is interrupted. When the cathode-gate voltage is removed, a main current flows between the anode electrode 6 and the cathode electrode 7. According to the present invention, the main current can be rapidly interrupted, since carriers in the p-emitter layer 2 are swept out as described above.

Figure 14:
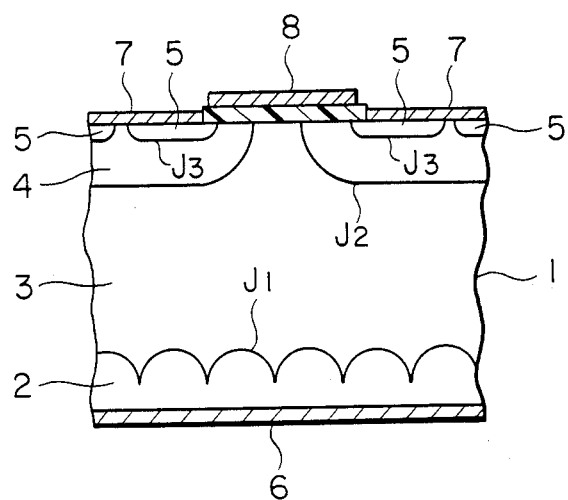
FIG. 14 is a fragmentary sectional view showing a conductivity modulation type MOSFET which is a further embodiment of the present invention.

FIG. 14 shows a case where the present invention is applied to the COMFET disclosed in a Japanese Patent Unexamined Publication No. 57-120369. In FIG. 14, the same reference numerals as in FIGS. 1A to 1C designate identical or equivalent parts. Referring to FIG. 14, the pn junction $J_1$ acts as a reverse blocking junction, and the pn junction $J_2$ acts as a forward blocking junction. When no potential is applied to the gate electrode 8 of MOSFET, the n-channel is not formed in the p-layer 4, and thus a main current does not flow. When an appropriate potential is applied to the gate electrode 8, the n-channel is formed in the p-layer 4, and a path which starts from the n-layer 3 and reaches the n-layer 5 through the n-channel, is formed. Thus, a current can flow from the p-layer 2 to the n-layer 5 through the n-layer 3 and the above path. In this state, when carriers injected from the n-layer 5 into the p-layer 4 pass through the n-layer 3 and are then absorbed by the p-layer 2, the thyristor action is produced. That is, the conductivity modulation takes place, and thus the device of FIG. 14 operates as a thyristor. When the potential applied to the gate electrode 8 is removed, the n-channel disappears, but the thyristor action is maintained. Accordingly, the current can flow as it was. However, when the main current become less than the holding current of thyristor, or the anode-cathode voltage is reversed in polarity, the device is turned off. At this time, according to the present invention, carriers in the semiconductor substrate 1 are rapidly swept out to the anode electrode 6 through the p-layer 2.

As has been explained in the foregoing, according to the present invention, there is provided a semiconductor device which has a reverse blocking capability, can be turned off at a high speed without containing any lifetime killer, and is small in leak current.

We claim:

1. A reverse blocking type semiconductor device comprising:
   a semiconductor substrate having a pair of principal surfaces and including four semiconductor layers in a region sandwiched between the principal surfaces, adjacent ones of said semiconductor layers being different in conductivity type from each other, one of the outermost semiconductor layers being surrounded by a semiconductor layer adjacent thereto, said one outermost semiconductor layer and said semiconductor layer adjacent thereto being exposed to one of said principal surfaces, wherein the other outermost semiconductor layer includes a first portion which has an impurity concentration gradient in a direction parallel to the other principal surface, and a second portion which is devoid of an impurity concentration gradient in a direction parallel to said other principal surface, wherein the second portion is narrower than the first portion along said direction parallel to said other principal surface;
   a cathode electrode kept in low-resistance contact with said one outermost semiconductor layer;
   a gate electrode lying in close proximity to said one outermost semiconductor layer; and
   an anode electrode kept in low-resistance contact with said first and second portions of said other outermost semiconductor layer.

2. A reverse blocking type semiconductor device according to claim 1, wherein said one outermost semiconductor layer is divided into a plurality of regions.

3. A reverse blocking type semiconductor device according to claim 1, wherein the width of said first portion which has an impurity concentration gradient in a direction parallel to the other principal surface and the width of said second portion which is devoid of an impurity concentration gradient in a direction parallel to the other principal surface are both substantially constant throughout a main operating region.

4. A reverse blocking type semiconductor device according to claim 1, wherein at least one pair of said first portions which have an impurity concentration gradient in a direction parallel to the other principal surface exists between two second portions which are devoid of an impurity concentration gradient in a direction parallel to the other principal surface, said at least one pair of first portions is connected at a portion having the minimum impurity concentration therein.

5. A reverse blocking type semiconductor device according to claim 1, wherein said other outermost semiconductor layer is a p-type semiconductor layer, and said one outermost semiconductor layer is a n-type semiconductor layer.

6. A reverse blocking type semiconductor device according to claim 1, wherein at least one pair of said first portions which have an impurity concentration gradient in a direction parallel to the other principal surface exists between two said second portions which are devoid of an impurity concentration gradient in a direction parallel to the other principal surface, and wherein the distance in a direction parallel to said other principal surface between said two second portions is sufficiently narrow so that the reverse voltage between said anode and said cathode electrodes is blocked.

7. A reverse blocking type semiconductor device according to claim 1, wherein said gate electrode is kept in low-resistance contact with the semiconductor layer adjacent to said one outermost semiconductor layer.

8. A reverse blocking type semiconductor device according to claim 1, wherein said one outermost semiconductor layer, said semiconductor layer adjacent to said one outermost semiconductor layer and a semiconductor layer adjacent to said other outermost semiconductor layer are exposed to said one of said principal surfaces, and wherein said gate electrode is provided to a portion of said one of said principal surfaces between said one outermost semiconductor layer and said semiconductor layer adjacent to said other outermost semiconductor layer through an insulating film.

9. A reverse blocking type semiconductor device comprising:
   a semiconductor substrate having a pair of principal surfaces and including at least two semiconductor layers in a region sandwiched between the principal surfaces, adjacent ones of said semiconductor layers being different in conductivity type from each other, one outermost semiconductor layer being exposed to one of said principal surfaces, and the other outermost semiconductor layer including a first portion which has an impurity concentration gradient in a direction parallel to the other principal surface, and a second portion which is devoid of an impurity concentration gradient in a direction parallel to said other principal surface, wherein the second portion is narrower than the first portion along said direction parallel to said other principal surface; and
   a pair of main electrodes each kept in low resistance contact with a corresponding one of said principal surfaces.

10. A reverse blocking type semiconductor device according to claim 9, wherein a third semiconductor layer having the same conductivity type as said other outermost semiconductor layer exists in said one outermost semiconductor lyer, said third semiconductor layer includes a portion which is extended in a direction parallel to said one of said principal surfaces and another portion which is extended in the direction of the thickness of said semiconductor substrate from said one of said principal surfaces and contacts with said portion which is extended in a direction parallel to said one of said principal surfaces, wherein a gate electrode is kept in low-resistance contact with said other portion which is extended in the direction of the thickness of said semiconductor substrate.

* * * * *